(12) United States Patent
Seo et al.

(10) Patent No.: US 9,472,266 B2
(45) Date of Patent: Oct. 18, 2016

(54) SEMICONDUCTOR DEVICE

(71) Applicant: SK hynix Inc., Icheon-si Gyeonggi-do (KR)

(72) Inventors: Jin Cheol Seo, Icheon-si (KR); Hee Jin Byun, Hwaseong-si (KR)

(73) Assignee: SK HYNIX INC., Icheon-Si (KR)

( * ) Notice: Subject to any disclaimer, the term of this patent is extended or adjusted under 35 U.S.C. 154(b) by 134 days.

(21) Appl. No.: 14/518,008

(22) Filed: Oct. 20, 2014

(65) Prior Publication Data
US 2016/0005453 A1    Jan. 7, 2016

(30) Foreign Application Priority Data

Jul. 4, 2014    (KR) .......................... 10-2014-0083676

(51) Int. Cl.
| | |
|---|---|
| *G06F 13/12* | (2006.01) |
| *G06F 13/38* | (2006.01) |
| *G11C 11/4093* | (2006.01) |
| *G11C 11/4096* | (2006.01) |
| *G11C 5/02* | (2006.01) |
| *G11C 7/10* | (2006.01) |
| *G11C 8/12* | (2006.01) |
| *G11C 11/408* | (2006.01) |

(52) U.S. Cl.
CPC ........... *G11C 11/4093* (2013.01); *G11C 5/025* (2013.01); *G11C 7/1006* (2013.01); *G11C 7/1039* (2013.01); *G11C 8/12* (2013.01); *G11C 11/408* (2013.01); *G11C 11/4096* (2013.01); *G11C 2207/105* (2013.01); *G11C 2207/108* (2013.01)

(58) Field of Classification Search
None
See application file for complete search history.

(56) References Cited

U.S. PATENT DOCUMENTS

| | | | |
|---|---|---|---|
| 7,738,311 B2 | 6/2010 | Youn et al. | |
| 2006/0023533 A1* | 2/2006 | Song ........................ | G11C 7/06 365/205 |
| 2006/0171211 A1* | 8/2006 | Shin ......................... | G11C 7/10 365/189.02 |
| 2008/0112251 A1* | 5/2008 | Youn ....................... | G11C 5/025 365/230.03 |
| 2008/0310240 A1* | 12/2008 | Kim ....................... | G11C 7/1006 365/189.05 |
| 2013/0163364 A1* | 6/2013 | Park ....................... | G11C 5/02 365/230.02 |

FOREIGN PATENT DOCUMENTS

KR    1020090070122 A    7/2009

* cited by examiner

*Primary Examiner* — David E Martinez
(74) *Attorney, Agent, or Firm* — William Park & Associates Ltd.

(57) ABSTRACT

A semiconductor device may include pad blocks configured for receiving and outputting data. The semiconductor device may also include input/output driving blocks configured to transfer data received from global input/output lines to the pad blocks in response to a read operation, and transfer data from the pad blocks to the global input/output lines in response to a write operation. The input/output driving blocks are disposed in a peripheral region and control a width of the data.

18 Claims, 5 Drawing Sheets

SEMICONDUCTOR DEVICE

CROSS-REFERENCES TO RELATED APPLICATION

The present application claims priority under 35 U.S.C. §119(a) to Korean application number 10-2014-0083676, filed on Jul. 4, 2014, in the Korean Intellectual Property Office, which is incorporated herein by reference in its entirety.

BACKGROUND

1. Technical Field

Various embodiments generally relate to semiconductor devices, and more particularly, to a technology for reducing the loading of global input/output lines.

2. Related Art

In general, a semiconductor memory device may include several tens of millions of memory cells for storing data. A semiconductor memory device may store or output data according to a command received from a central processing unit.

That is to say, data may be stored in memory cells that correspond with the addresses inputted from the central processing unit. This may occur when the central processing unit requests a write operation. The data stored in the memory cells corresponding to the addresses inputted from the central processing unit may then be outputted when the central processing unit requests a read operation.

In other words, the data inputted through data pads are inputted to memory cells through data input paths in the write operation. The data stored in memory cells are outputted to an exterior by way of data pads through data output paths.

Semiconductor memory devices may trend toward high speed operation and large capacity, and thus, the number of data consecutively inputted through one data pad is increasing.

In a semiconductor memory device, in particular, a DRAM, a data input/output bandwidth means the number of data which may be simultaneously read or written through addressing of one time.

By controlling the number of data to be inputted and outputted, according to a use of the DRAM, it is possible to perform an operation efficiently. The data input/output bandwidth may also mean the number of data input/output pads which are provided in the DRAM.

As the operation speed and the processing capacity of a semiconductor memory device increases, the semiconductor memory device includes a plurality of pads and a plurality of data input/output lines, and may input/output a plurality of data at a time.

According to the number of data which may be simultaneously processed by a semiconductor memory device in one read or write operation, X4, X8 and X16 input/output modes are used. In other words, the X4 input/output mode means a mode in which 4 data are simultaneously inputted and outputted in one read or write operation, and the X8 and X16 input/output modes mean modes in which 8 and 16 data are simultaneously inputted and outputted in one read or write operation, respectively.

In a conventional semiconductor memory device, a number of multiplexers for performing a X4 operation and a number of drivers for driving data regions with a DQ0 to DQ3 bandwidth and a DQ4 to DQ7 bandwidth are disposed in a Y-hole region. Therefore, the size of the Y-hole region increases due to the presence of the drivers for driving the data region with the DQ4 to DQ7 bandwidth and the multiplexers.

SUMMARY

In an embodiment, a semiconductor device may include pad blocks configured for receiving and outputting data. The semiconductor device may also include input/output driving blocks configured to transfer data received from global input/output lines to the pad blocks in response to a read operation, and to transfer data from the pad blocks to the global input/output lines in response to a write operation. The input/output driving blocks may be disposed in a peripheral region and may control a width of the data.

In an embodiment, a semiconductor device may include a plurality of banks, and pad blocks configured for receiving and outputting data. The semiconductor device may also include input/output driving blocks disposed in a peripheral region located between the plurality of banks and the pad blocks, and may be configured to control a width of data blocks. The semiconductor device may include data transfer blocks configured to transfer data between the input/output driving blocks and the banks.

DETAILED DESCRIPTION

Hereinafter, a semiconductor device will be described below with reference to the accompanying drawings through various examples of embodiments.

Various embodiments may be directed to a technology for transmitting data to global input/output lines in a peripheral circuit region by distinguishing data bandwidths, thereby decreasing the area of a Y-hole region and reducing the loading of the global input/output lines.

According to various embodiments, since data is transmitted to global input/output lines in a peripheral circuit region by distinguishing data bandwidths, the area of a Y-hole region may be decreased by removing the drivers and multiplexers disposed in the Y-hole region.

Further, according to various embodiments, the loading of the global input/output lines may be reduced.

Figure 1:
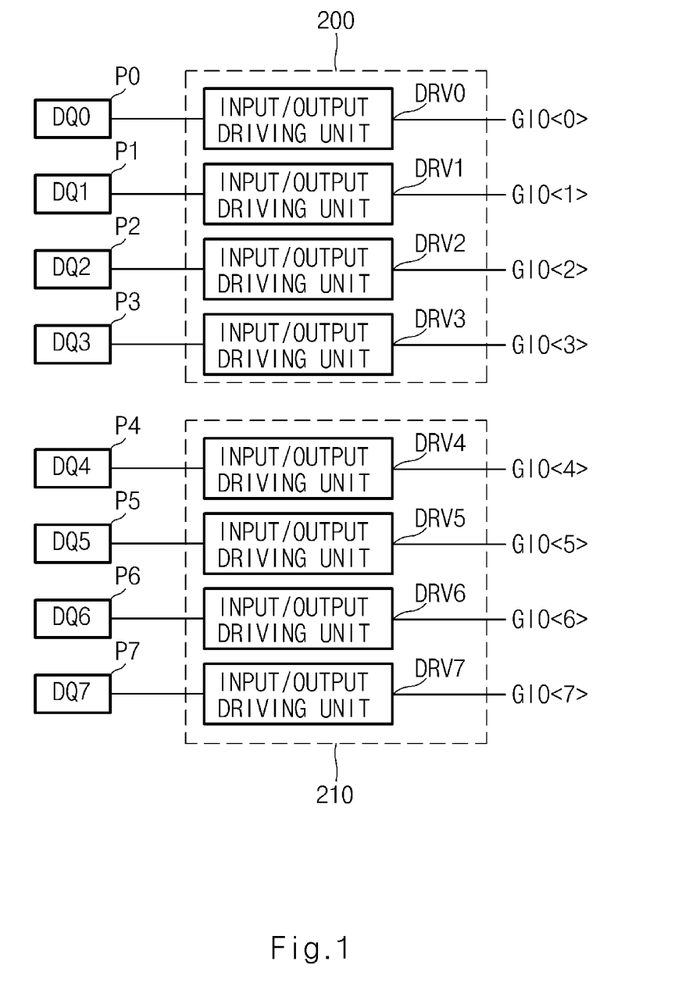
FIG. 1 is a configuration diagram schematically illustrating a representation of an example of a semiconductor device in accordance with an embodiment.

FIG. 1 is a configuration diagram schematically illustrating a representation of an example of a semiconductor device in accordance with an embodiment.

The semiconductor device in accordance with an embodiment may include a plurality of pads P0 to P7, a plurality of input/output driving units DRV0 to DRV7, and a plurality of global input/output lines GIO<0:7>.

The plurality of pads P0 to P7 may be used to input data DQ0 to DQ7 configured to have, for example, a maximum of 8 bits, from an external data source (not shown). In other words, data DQ0 to DQ7 configured to have the 8 bits may be inputted through first to eighth pads P0 to P7, or data configured to have 4 bits may be inputted through only the first to fourth pads P0 to P3.

The global input/output lines GIO<0:7> may be used for bidirectional data transfer between the pads P0 to P7 and banks. For example, the global input/output lines GIO<0:7> may be provided with the same number as the pads P0 to P7. The global input/output lines GIO<0:7> may be commonly connected to the banks.

The plurality of input/output driving units DRV0 to DRV7 may be disposed between the plurality of pads P0 to P7 and the plurality of global input/output lines GIO<0:7>, respectively. The pluralities of input/output driving units DRV0 to DRV7 drive corresponding bit data. The bit data is driven such that data of the plurality of pads P0 to P7 may have a sufficient degree of power to be transferred to the banks through the global input/output lines GIO<0:7>.

First group input/output driving units DRV0 to DRV3 may correspond to an input/output driving block 200 which will be described below. Second group input/output driving units DRV4 to DRV7 may correspond to an input/output driving block 210 which will be described below.

In an embodiment, the global input/output lines GIO<4:7> for driving the data DQ<4:7> are not connected with the global input/output lines GIO<0:3>. Namely, by transferring data through division of the global input/output lines GIO<0:7> in a peripheral region, the loading of the global input/output lines GIO<0:3> may be reduced.

Figure 2:
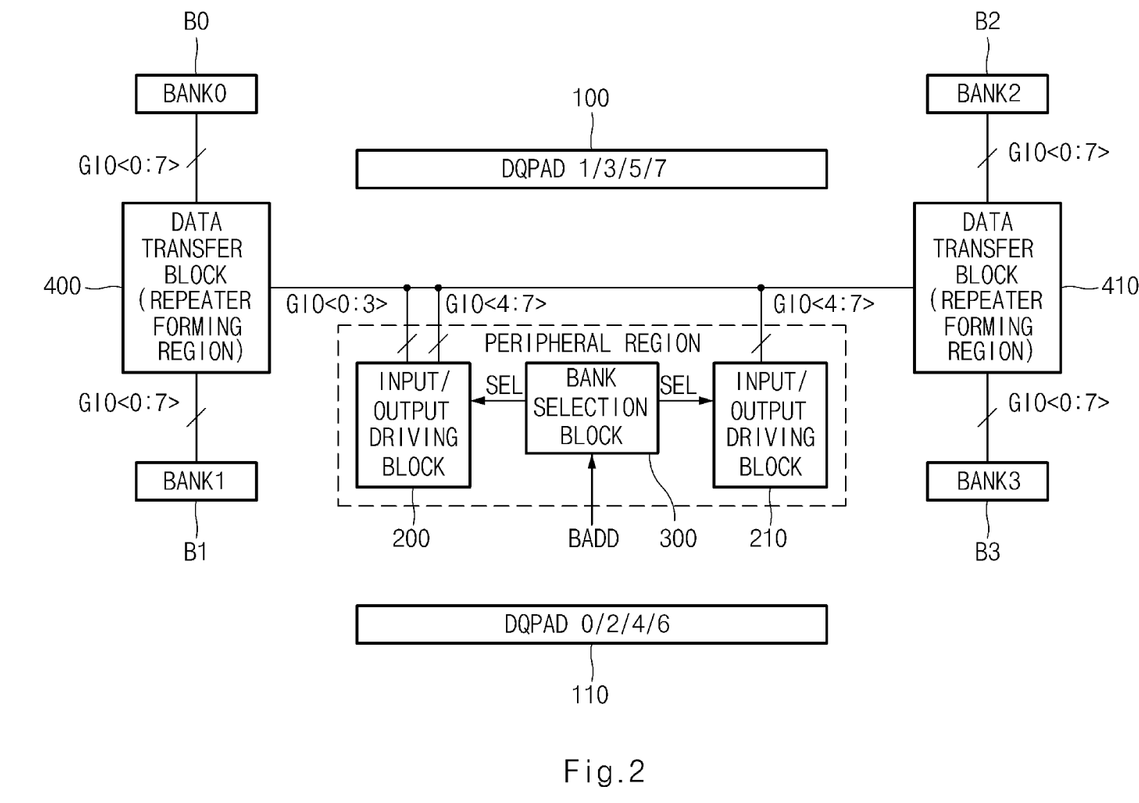
FIG. 2 is a configuration diagram illustrating a representation of a semiconductor device in accordance with an embodiment.

FIG. 2 is a configuration diagram illustrating a representation of a semiconductor device in accordance with an embodiment.

For the sake of convenience in explanation, a semiconductor device, which has 4 banks and performs a X8 data width or X4 data width optional operation for each bank, will be described as an example. While it is described in an embodiment that 4 banks are provided, it is to be noted that the number of memory banks is not specifically limited.

The semiconductor device in accordance with an embodiment may include a plurality of pad blocks 100 and 110, a plurality of input/output driving blocks 200 and 210, and a bank selection block 300. The semiconductor device may include a plurality of data transfer blocks 400 and 410, and a plurality of banks B0 to B3.

The semiconductor device may include first to fourth banks B0 to B3. The peripheral region may be defined between a memory region where the first and third banks B0 and B2 are disposed and a memory region where the second and fourth banks B1 and B3 are disposed. In the semiconductor device in accordance with an embodiment, the plurality of input/output driving blocks 200 and 210 and the bank selection block 300 are disposed in the peripheral region.

The plurality of input/output driving blocks 200 and 210 may be connected to the plurality of global input/output lines GIO<0:7>. The input/output driving block 200 may be connected with first group global input/output lines GIO<0:3> or second group global input/output lines GIO<4:7>. The input/output driving block 210 may be connected with the second group global input/output lines GIO<4:7>.

In examples where the semiconductor device operates with a X8 data width, both the input/output driving blocks 200 and 210 operate and transfer data to the plurality of global input/output lines GIO<0:7>. The plurality of global input/output lines GIO<0:7> transfer the data transferred from the plurality of input/output driving blocks 200 and 210, to the first to fourth banks B0 to B3.

In examples where the semiconductor device operates with a X4 data width, the input/output driving block 200 operates. The input/output driving block 200 may input/output data with the X4 data width through the global input/output lines GIO<0:3> or may input/output data with the X4 data width through the global input/output lines GIO<4:7>.

The input/output driving blocks 200 and 210 may drive the write data applied from the plurality of pad blocks 100 and 110 and output the write data to the global input/output lines GIO<0:7>, or may drive the read data applied from the global input/output lines GIO<0:7> and output the read data to the plurality of pad blocks 100 and 110.

The pad block 100 may input/output odd data DQ 1, 3, 5 and 7. The pad block 110 may input/output even data DQ 0, 2, 4 and 6. While it is described in an embodiment that the odd pad block 100 and the even pad block 110 are disposed up and down with respect to the peripheral region, it is to be noted that the embodiments are not limited to such and pad blocks may be disposed in line without being distinguished as odd and even pad blocks or may be disposed in other layout patterns.

As the processing technology of a semiconductor memory device is gradually developed and becomes highly developed, the number of memory banks which are formed in a semiconductor memory device may gradually increase. In order to efficiently input/output data to and from the memory banks the number of which gradually increases in this way, the design technology of a semiconductor memory device is being changed in a variety of ways.

Among these changes, there may be a scheme in which a plurality of memory banks are disposed in a stack structure or a scheme in which the interface between a controller and a semiconductor memory device is changed to various operation modes such as of the X4 data width and the X8 data width.

The X4 and X8 operation modes may be implemented to increase the diversity of the interface of the semiconductor memory device, and may mean to control the number of input/output pads (generally referred to as DQ pads) which are used when interfacing data between the controller and the semiconductor memory device.

For example, in the examples whereby a semiconductor memory device which has 8 data input/output pads, it may be possible to set an operation mode to the X8 operation mode or the X4 operation mode. The semiconductor memory device performs data input/output operations through the 8 input/output pads of the input/output pad blocks 100 and 110 in the examples where the operation mode of the semiconductor memory device is set to the X8 operation mode. The semiconductor memory device performs data input/output operations through 4 input/output pads of the input/output pad block 100 or 110 in the examples where the operation mode of the semiconductor memory device is set to the X4 operation mode.

The bank selection block 300 may be inputted with a bank address BADD and may store information regarding which bank is to be selected and activated, and accordingly, may activate the input driving block 200 or the input/output driving block 210. If an address for a bank select command is inputted from an external controller, after the address is latched by a bank address latch, the bank address BADD is inputted to the bank selection block 300.

The data transfer blocks 400 and 410 may be formed in regions where repeaters for preventing attenuation of outputs are formed. The repeater forming regions may be defined, for example, as regions between the banks B0 and B2 and the peripheral region.

The data transfer blocks 400 and 410 may transfer the data read from the banks B0 to B3, to the global input/output lines GIO<0:7>, or may transfer the data applied through the global input/output lines GIO<0:7>, to the banks B0 to B3.

The data transfer block 400 may be a configuration for transmitting and receiving data to and from the left banks B0 and B1. The data transfer block 410 may be a configuration for transmitting and receiving data to and from the right banks B2 and B3.

For reference, in an embodiment, the peripheral region (a peripheral circuit region) may mean a region which includes various circuits needed for operations of the semiconductor device. The regions of the banks B0 to B3 may include, for example but not limited to cell arrays, bit line sense amplifiers, sub word line drivers, and so forth. When viewed from the peripheral region, the banks B0 and B2 and the pad block 100 may be disposed up, and the banks B1 and B3 and the pad block 110 may be disposed down.

Figure 3:
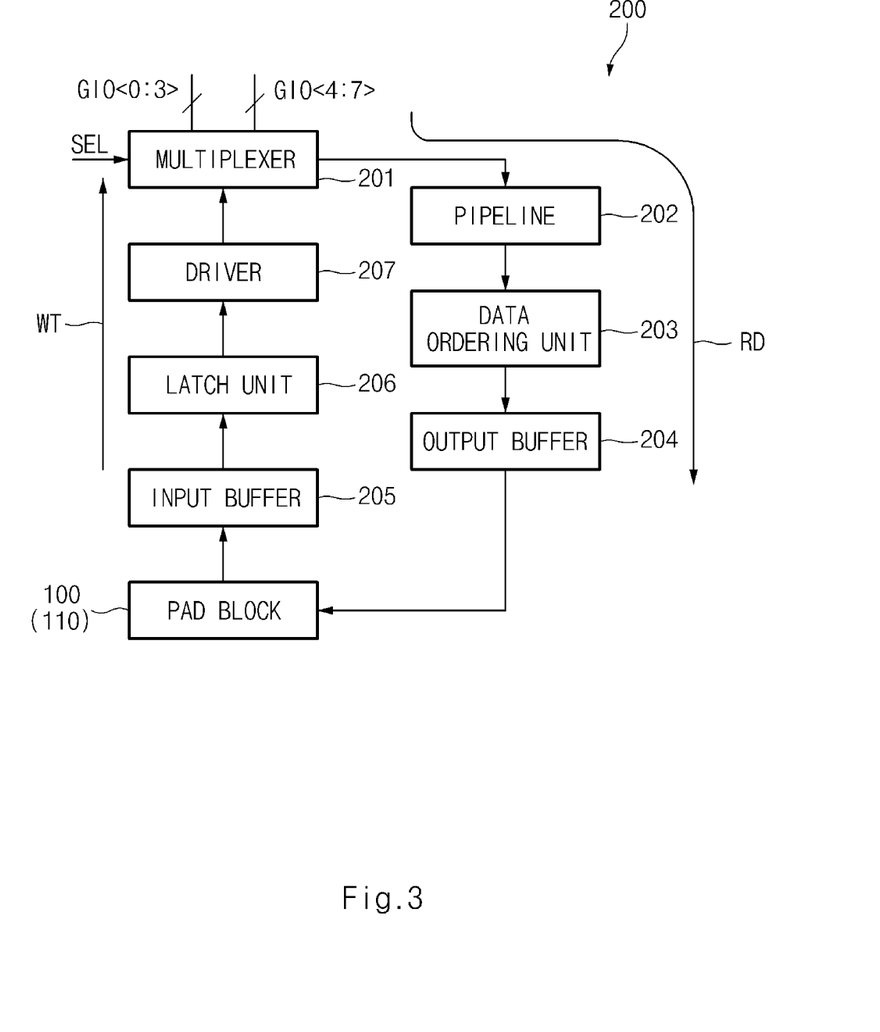
FIG. 3 is a detailed configuration diagram of a representation of the input/output driving block illustrated in FIG. 2.

FIG. 3 is a detailed configuration diagram of a representation of the input/output driving blocks 200 and 210 illustrated in FIG. 2. In an embodiment, the configuration of the input/output driving block 200 will be described as an example as illustrated in FIG. 3.

The input/output driving block 200 may include a multiplexer 201, a pipeline 202, a data ordering unit 203, and an output buffer 204. The input/output driving block 200 may include an input buffer 205, a latch unit 206, and a driver 207.

The multiplexer 201, the pipeline 202, the data ordering unit 203 and the output buffer 204 represent a read path RD through which data may be outputted to the pad blocks 100 and 110. The input buffer 205, the latch unit 206, the driver 207 and the multiplexer 201 represent a write path WT through which data may be inputted through the pad blocks 100 and 110.

When observing the read path RD, the data sensed and amplified by a sense amplifier SA (see FIG. 4) may be applied to the multiplexer 201 through the global input/output lines GIO<0:7>. In the examples where the semiconductor device operates with the X4 data width, the multiplexer 201 selects the data of the first group global input/output lines GIO<0:3> among the plurality of global input/output lines GIO<0:7> and transfers the data to the pipeline 202.

Also, in the examples where the semiconductor device operates with the X4 data width, the multiplexer 201 may select the data of the second group global input/output lines GIO<4:7> among the plurality of global input/output lines GIO<0:7> and transfers the data to the pipeline 202. Information on whether the multiplexer 201 is to select the first group global input/output lines GIO<0:3> or the second group global input/output lines GIO<4:7> is determined according to a select signal SEL. The select signal SEL may be applied from the bank selection block 300.

The pipeline 202 may output the data applied from the multiplexer 201, to the data ordering unit 203 in synchronization with a clock. For example, the pipeline 202 may output the data applied from the multiplexer 201, as rising data and falling data, in synchronization with an internal clock. The pipeline 202 may convert the parallel data applied from the multiplexer 201, into serial data.

The data ordering unit 203 may determine the output order of the data applied from the pipeline 202 in response to an order determination signal, and may sequentially output the data to the output buffer 204. The order determination signal may be a signal for determining an output order in which the data applied in parallel through the global input/output lines GIO<0:7> are outputted in series. The output buffer 204 may buffer the data applied from the data ordering unit 203 and may output the data to the pad blocks 100 and 110.

Next, when observing the write path WT, the data applied to the pad blocks 100 and 110 may be buffered by the input buffer 205. The latch unit 206 may latch the data applied from the input buffer 205, control a setup/hold time, and output the data to the driver 207. The latch unit 206 may store the data by distinguishing the first group data DQ<0:3> and the second group data DQ<4:7>. The driver 207 may drive the data applied from the latch unit 206 and transfer the data to the multiplexer 201.

In the examples where the semiconductor device operates with the X4 data width, the multiplexer 201 may transfer the data applied from the driver 207 to the first group global input/output lines GIO<0:3> or the second group global input/output lines GIO<4:7>.

Information on whether the multiplexer 201 is to select the first group global input/output lines GIO<0:3> or the second group global input/output lines GIO<4:7> is determined according to the select signal SEL. The select signal may be applied from the bank selection block 300. The multiplexer 201 may disable the data of the lines not used, among the data of the first group global input/output lines GIO<0:3> and the data of the second group global input/output lines GIO<4:7>.

In an embodiment, by the multiplexer 201 which is disposed in the peripheral region, the first group global input/output lines GIO<0:3> may be selected and the data DQ<0:3> may be transferred, or the second group global input/output lines GIO<4:7> may be selected and the data DQ<4:7> may be transferred.

In an embodiment, since the multiplexer 201 is disposed outside of the Y-hole region of a column but in the peripheral region, the area of the Y-hole region may be decreased and current may be reduced. Moreover, since a write driving unit WD (see FIG. 4) and the sense amplifier SA which exist in the peripheral region are disposed in a repeater forming region, the area of the peripheral region may not increase.

Figure 4:
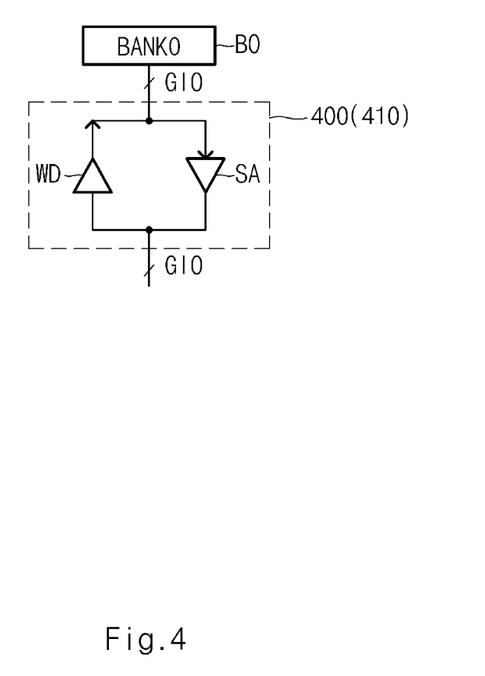
FIG. 4 is a detailed configuration diagram of a representation of the data transfer block illustrated in FIG. 2.

FIG. 4 is a detailed configuration diagram of a representation of the data transfer blocks 400 and 410 illustrated in FIG. 2. In an embodiment illustrated in FIG. 4, the configuration of the data transfer block 400 will be described as an example. The data transfer block 400 may include the write driving unit WD and the sense amplifier SA.

In the example of performing a write operation for inputting data, the data may be received by the pad blocks 100 and 110 from an exterior of the semiconductor device. Then, the data may be transferred to the write driving unit WD through the peripheral region and the global input/output lines GIO<0:7>. The write driving unit WD may drive the data, and the driven data may be transferred to the bit lines which are selected by an address and may then be stored in the memory cells, for example, of the bank B0.

In the example of performing a read operation for outputting data, the data of the memory cells of the bank B0 may be transferred to bit lines. The data of the bit lines may be amplified by the sense amplifier SA and may be transferred to the global input/output lines GIO<0:7>. The data of the global input/output lines GIO<0:7> may be transferred to an exterior of the semiconductor device through the peripheral region and the pad blocks 100 and 110.

In an embodiment of FIG. 4, although bus lines such as local input/output lines and data input/output lines may be disposed between the global input/output lines GIO<0:7> and the bank B0, these lines are not illustrated for the sake of convenience in explanation.

In an embodiment, the data transfer blocks 400 and 410 may be positioned in the repeater forming regions of the global input/output lines GIO<0:7>. Therefore, since the write driving unit WD and the sense amplifier SA which may be disposed in the input/output driving blocks 200 and 210 may not be provided in the peripheral region or provided outside the peripheral region, the area of the peripheral region may be decreased.

The semiconductor devices discussed above (see FIGS. 1-4) are particular useful in the design of memory devices, processors, and computer systems. For example, referring to FIG. 5, a block diagram of a system employing the semiconductor devices in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 5:
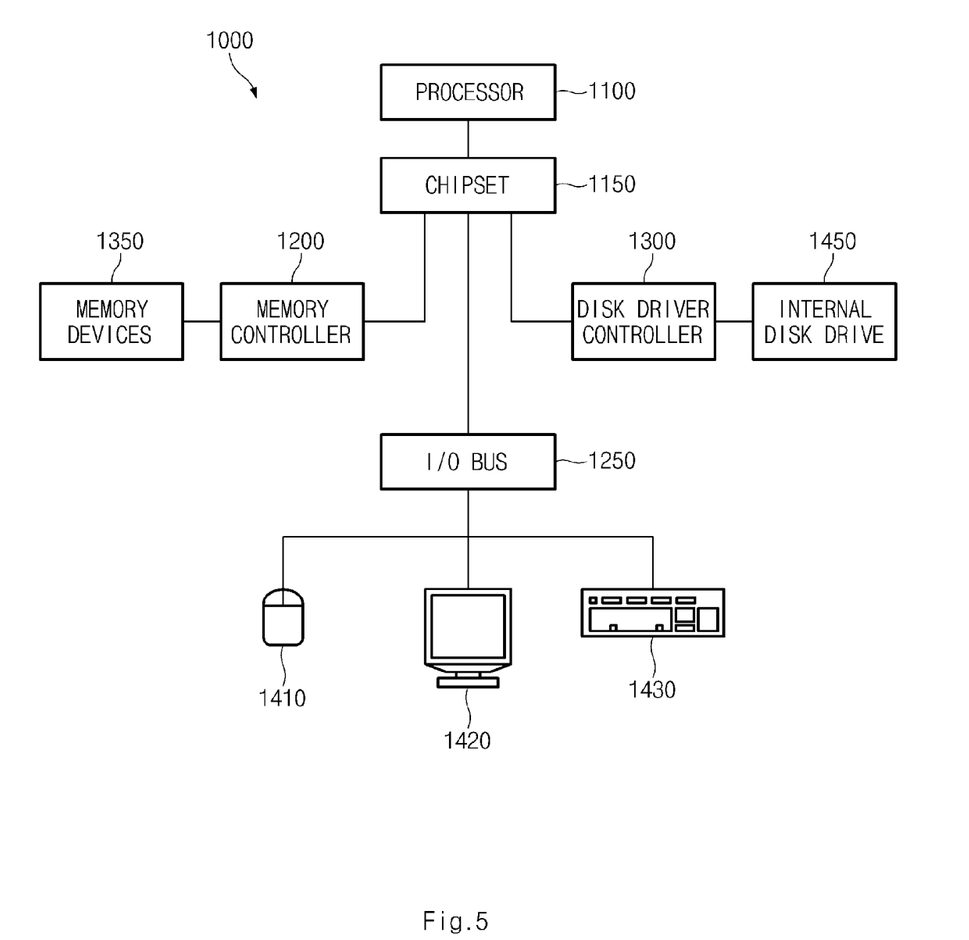
FIG. 5 illustrates a block diagram of an example of a representation of a system employing the semiconductor devices in accordance with the embodiments discussed above with relation to FIGS. 1-4.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-4, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor devices as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   pad blocks configured for receiving and outputting data; and
   input/output driving blocks configured to transfer data received from global input/output lines to the pad blocks in response to a read operation, and to transfer data from the pad blocks to the global input/output lines in response to a write operation,
   wherein the input/output driving blocks are disposed in a peripheral region and control a width of the data,
   wherein the input/output driving blocks comprise a bank selection block configured to include bank select information and output a select signal to the input/output driving blocks to control the width of the data.

2. The semiconductor device according to claim 1, wherein the input/output driving blocks comprise:
   a first input/output driving block selectively coupled with first group global input/output lines and second group global input/output lines; and
   a second input/output driving block coupled with the second group global input/output lines.

3. The semiconductor device according to claim 2, wherein, the first input/output driving block is configured to operate when the semiconductor device operates with a X4 data width, and the first input/output driving block and the second input/output driving block are configured to operate when the semiconductor device operates with a X8 data width.

4. The semiconductor device according to claim 2, wherein the first input/output driving block is coupled with either the first group global input/output lines or the second group global input/output lines when the semiconductor device operates with the X4 data width.

5. The semiconductor device according to claim 1, wherein each of the input/output driving blocks comprises:
   a multiplexer configured to select any one of the first group global input/output lines and the second group global input/output lines;
   a pipeline configured to synchronize data received from the multiplexer with a clock signal;
   a data ordering unit configured to align data received from the pipeline; and an output buffer configured to buffer data received from the data ordering unit and output the buffered data to the pad blocks.

6. The semiconductor device according to claim 1, wherein each of the input/output driving blocks comprises:
   an input buffer configured to buffer the data received from the pad blocks;
   a latch unit configured to latch data output from the input buffer;
   a driver configured to drive data output from the latch unit; and
   a multiplexer configured to select any one of the first group global input/output lines and the second group global input/output lines, and transfer data output from the driver to selected global input/output lines.

7. The semiconductor device according to claim 1, further comprising:
   data transfer blocks configured to transfer data between the input/output driving blocks and banks.

8. The semiconductor device according to claim 7, wherein the data transfer blocks are disposed in repeater forming regions.

9. The semiconductor device according to claim 7, wherein each of the data transfer blocks comprises:
   a sense amplifier configured to sense and amplify the data of the bank and output amplified data to the input/output driving block; and
   a write driving unit configured to drive data received from the input/output driving block and output driven data to the banks.

10. A semiconductor device comprising:
    a plurality of banks;
    pad blocks configured for receiving and outputting data;
    input/output driving blocks disposed in a peripheral region located between the plurality of banks and the pad blocks, and configured to control a width of data; and
    data transfer blocks configured to transfer data between the input/output driving blocks and the banks,
    wherein the input/output driving blocks comprise a bank selection block configured to include bank select information and output a select signal to the input/output driving blocks to control the width of the data.

11. The semiconductor device according to claim 10, wherein the input/output driving blocks comprise:
    a first input/output driving block selectively coupled with first group global input/output lines and second group global input/output lines; and
    a second input/output driving block coupled with the second group global input/output lines.

12. The semiconductor device according to claim 11, wherein the first input/output driving block is configured to operate when the semiconductor device operates with a X4 data width, and the first input/output driving block and the second input/output driving block are configured to operate when the semiconductor device operates with a X8 data width.

13. The semiconductor device according to claim 11, wherein the first input/output driving block is coupled with either the first group global input/output lines or the second group global input/output lines when the semiconductor device operates with the X4 data width.

14. The semiconductor device according to claim 10, wherein each of the input/output driving blocks comprises:
    a multiplexer configured to select any one of the first group global input/output lines and the second group global input/output lines;
    a pipeline configured to synchronize data received from the multiplexer with a clock signal;
    a data ordering unit configured to align data received from the pipeline; and
    an output buffer configured to buffer data received from the data ordering unit and output the buffered data to the pad blocks.

15. The semiconductor device according to claim 10, wherein each of the input/output driving blocks comprises:
    an input buffer configured to buffer the data received from the pad blocks;
    a latch unit configured to latch data output from the input buffer;
    a driver configured to drive data output from the latch unit; and
    a multiplexer configured to select any one of the first group global input/output lines and the second group global input/output lines, and transfer data output from the driver to selected global input/output lines.

16. The semiconductor device according to claim 10, wherein the data transfer blocks are disposed in repeater forming regions.

17. The semiconductor device according to claim 10, wherein each of the data transfer blocks comprises:
    a sense amplifier configured to sense and amplify data of the plurality of banks and output resultant data to the input/output driving block.

18. The semiconductor device according to claim 10, wherein each of the data transfer blocks comprises:
    a write driving unit configured to drive the data of the input/output driving block and output driven data to the plurality of banks.

* * * * *